(12) United States Patent
Goto

(10) Patent No.: US 7,768,046 B2
(45) Date of Patent: Aug. 3, 2010

(54) IMAGE SENSOR

(75) Inventor: Sumitaka Goto, Chiba (JP)

(73) Assignee: Seiko Instruments Inc. (JP)

( * ) Notice: Subject to any disclaimer, the term of this patent is extended or adjusted under 35 U.S.C. 154(b) by 136 days.

(21) Appl. No.: 11/375,295

(22) Filed: Mar. 14, 2006

(65) Prior Publication Data

US 2006/0208333 A1 Sep. 21, 2006

(30) Foreign Application Priority Data

Mar. 15, 2005 (JP) ............................. 2005-072261

(51) Int. Cl.
*H01L 31/062* (2006.01)
*H01L 31/113* (2006.01)

(52) U.S. Cl. ............... 257/292; 257/233; 257/E27.132; 438/78

(58) Field of Classification Search ................. 257/233, 257/292, 436, E27.132; 438/73, 78
See application file for complete search history.

(56) References Cited

U.S. PATENT DOCUMENTS 4,961,097 A * 10/1990 Pirastehfar et al. .......... 257/461
5,360,987 A * 11/1994 Shibib .......................... 257/446
5,671,914 A * 9/1997 Kalkhoran et al. ............ 257/77
6,075,275 A * 6/2000 Irissou ......................... 257/458
6,255,681 B1 * 7/2001 Pan ............................. 257/292

* cited by examiner

*Primary Examiner*—Lynne A Gurley
*Assistant Examiner*—Meiya Li
(74) *Attorney, Agent, or Firm*—Adams & Wilks

(57) ABSTRACT

An image sensor has a semiconductor substrate of a first conductivity type having a photo-detecting surface and a semiconductor region of a second conductivity type disposed under the photo-detecting surface and forming a junction with the semiconductor substrate. A dielectric body is provided in the semiconductor substrate beneath the junction so that a width of the dielectric body in a direction parallel to the photo-detecting surface does not extend beyond a width of the semiconductor region in the direction parallel to the photo-detecting surface. The dielectric body is polarized due to charges forming a depletion region generated by the semiconductor substrate and the semiconductor region. A width of the dielectric body is approximately equal to a width of an inner surface of the depletion in the direction parallel to the photo-detecting surface of the semiconductor substrate.

23 Claims, 5 Drawing Sheets

IMAGE SENSOR

BACKGROUND OF THE INVENTION

1. Field of the Invention

The present invention relates to a photodiode to be employed in an image sensor, and more particularly, to a photodiode to be employed in a CCD, a close contact type image sensor, or the like.

2. Description of the Related Art

In recent years, vigorous development is being made on a photodetector employed in, for example, a charge-coupled device (CCD) using a reduction optical system, which is used in a digital camera, a video camera, or the like and a close contact type image sensor of a one-to-one optical system.

In particular, a photodiode is a photodetector for converting light irradiated thereon into an electrical signal. By using the photodiode, an image projected on a photo-detecting surface thereof can be converted into an electrical signal.

Improvement of signal to noise ratio (SN ratio) in a photodiode is important for increase in sensitivity, and can be realized by reducing a total junction capacitance of the photodiode as will be described below.

FIG. 5A is a schematic view for explaining a structure of a conventional photodiode and shows a section of the photodiode in a direction perpendicular to a photo-detecting surface.

The conventional photodiode includes a cathode 2, an auxiliary cathode 3, a substrate 4, and an anode 5.

Of those constituents, the cathode 2 and the auxiliary cathode 3 are each formed of an n-type semiconductor, and the substrate 4 and the anode 5 are each formed of a p-type semiconductor.

A higher impurity concentration is set in the cathode 2 than in the auxiliary cathode 3 to give higher carrier (electron) concentration. A higher impurity concentration is set in the anode 5 than in the substrate 4 to give higher carrier (hole) concentration. The higher impurity concentration in the cathode 2 and in the anode 5 is for obtaining sufficient contact with a wiring made of a metal.

In general, when a junction between an n-type semiconductor and a p-type semiconductor is made, holes diffuse from the p-type region to the n-type region on a junction surface and simultaneously electrons diffuse from the n-type region to the p-type region, generating a region containing no carrier (depletion layer). In FIG. 5A, a depletion layer 10 is indicated as a region defined by dotted lines. In the depletion layer 10 a capacitor (capacitance) is formed since both carriers don't exist, leaving positive and negative impurity ions held in a crystal lattice.

FIG. 5B is a schematic view showing a capacitor formed by the depletion layer 10.

The capacitor formed by the depletion layer 10 covers an entire junction region of the p-type semiconductor and the n-type semiconductor. The entire junction region can be separated as a bottom capacitor region, which is the bottom portion of the auxiliary cathode 3, and a side capacitor region, which is the side portion of the auxiliary cathode.3.

A capacitor 21 (capacitance Ci) corresponds to the bottom capacitor region and a capacitor 22 (capacitance Cg) corresponds to the side capacitor region.

The (total) junction capacitance of the p-type semiconductor and the n-type semiconductor (total junction capacitance of the auxiliary cathode 3 and the substrate 4) is equal to the composite of the capacitances of the capacitor 21 and the capacitor 22.

The capacitor 21 and the capacitor 22 are connected in parallel to each other, so the junction capacitance Cs is expressed by the following equation (1).

$$Cs=Cg+Ci \quad (1)$$

Further, a total diode capacitance Ct of the photodiode is the sum of the junction capacitance Cs and a cathode wiring capacitance Ch, and is therefore expressed by the following equation (2).

$$Ct=Cs+Ch \quad (2)$$

Further, a photo-detection voltage Vs of the photodiode is determined by an amount of photocharge Qp induced by light and the total diode capacitance Ct, and is therefore expressed by the following equation (3).

$$Vs=Qp/Ct \quad (3)$$

As is apparent from the equation (3), a large photocharge Qp or a small capacitance Ct is needed to have an increased photo-detection voltage Vs to improve the SN ratio.

JP 11-112006 A discloses a technique by which reduction in the total junction capacitance Cs reduces the total diode capacitance Ct. This document discloses a technique by which a cathode is enclosed with an auxiliary cathode having a lower impurity concentration to reduce the total junction capacitance Cs. The cathode and the auxiliary cathode correspond to the cathode 2 and the auxiliary cathode 3 of FIGS. 5A and 5B, respectively.

However, further improvement of SN ratio in the photodiode has been still demanded in the conventional technique. In particular, downsizing (area reduction) of the photodiode has been in progress, raising a need for technique of achieving a sufficient SN ratio, which can be applied to even such a downsized photodiode.

SUMMARY OF THE INVENTION

The present invention has been made in view of the above, and therefore has an object to increase a detection voltage of a photodiode for the purpose of improving an SN ratio.

To achieve the above-described object, according to a first aspect of the present invention, there is provided an image sensor, including: a semiconductor Substrate of a first conductivity type on which a photo-detecting surface is formed; a semiconductor region of a second conductivity type which is joined to the semiconductor substrate; and a dielectric provided in the semiconductor substrate and polarized owing to a charge forming a depletion layer region which is generated by joining the semiconductor substrate and the semiconductor region together.

According to a second aspect of the present invention, in the first aspect, the dielectric may include an oxide of a semiconductor constituting the semiconductor substrate.

According to a third aspect of the present invention, in the first or second aspect, the dielectric may be in one of a state where the dielectric is in contact with the depletion layer region and a state where at least a part of the dielectric is, provided in the depletion layer region.

According to the present invention, the detection voltage of the photodiode can be increased.

DETAILED DESCRIPTION OF THE PREFERRED EMBODIMENT (1) Outline of embodiment

Provided in a substrate of a photodiode is a buried oxide which is opposed to a cathode and is in contact with a lower end of a depletion layer.

The buried oxide is polarized owing to a charge forming the depletion layer, and thus works as a capacitor.

Thus, a capacitor formed in the depletion layer and the capacitor of the buried oxide are connected in series to each other, which reduces a total junction capacitance Cs. This increases the light detection voltage Vs according to the equation (3) since the amount of photocharge Qp is constant. As a result, an improved SN ratio is achieved.

(2) Details of Embodiment

Figure 1:
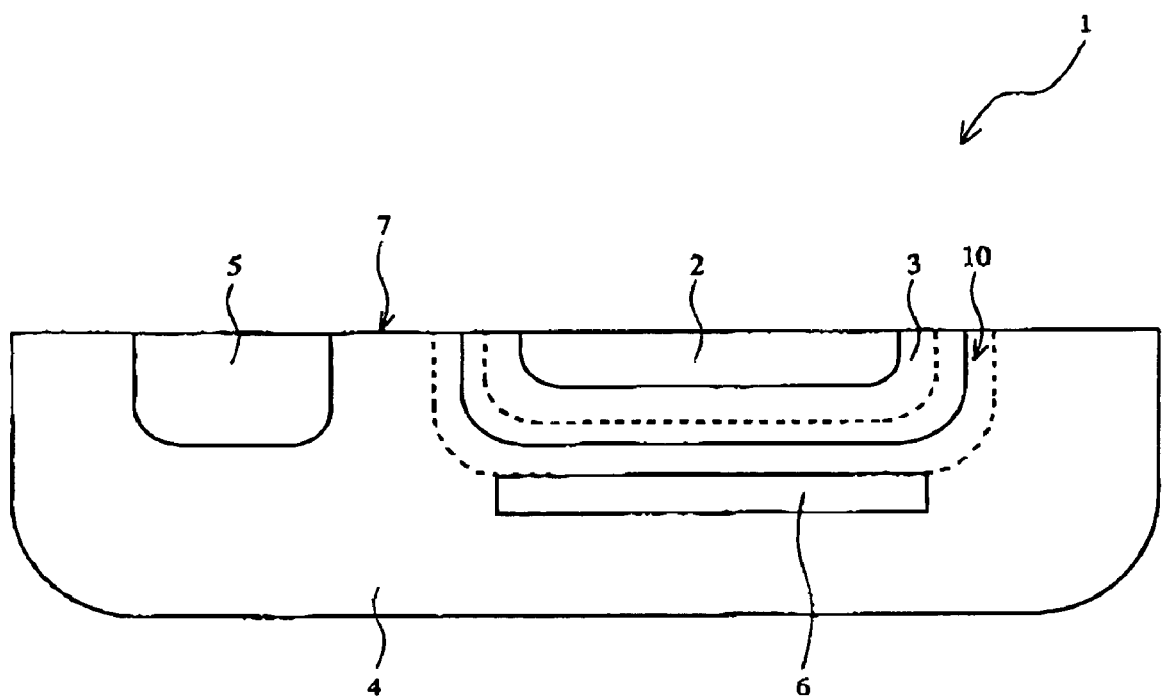
FIG. 1 is a schematic view showing a section of a photodiode in a direction perpendicular to a photo-detecting surface according to an embodiment of the present invention.

FIG. 1 is a schematic view for explaining a structure of a photodiode according to this embodiment and shows a section of a photodiode in a direction perpendicular to a photo-detecting surface.

A photodiode 1 includes a cathode 2, an auxiliary cathode 3, a substrate 4, an anode 5, and a buried oxide 6. The substrate 4 and the anode 5 are each formed of a p-type semiconductor. The cathode 2 and the auxiliary cathode 3 are each formed of an n-type semiconductor. The buried oxide 6 is formed of the oxide of the semiconductor (for example, silicon or germanium) forming the substrate 4.

The anode 5 has a higher impurity concentration than the substrate 4 and the cathode 2 has a higher impurity concentration than the auxiliary cathode 3.

The differences in impurity concentration provide the low impurity concentration at the junction region, reducing the total junction capacitance.

Note that the photodiode 1 is not limited to the above-mentioned structure. The anode 5 and the substrate 4, and the cathode 2 and the auxiliary cathode 3 may have the same impurity concentration, respectively, and thus the photodiode 1 may include a junction between a p-type semiconductor and an n-type semiconductor having a uniform impurity concentration, respectively.

A photo-detecting surface 7 is formed on the substrate 4 in a plane shape, being exposed to space. The anode 5 is formed in the photo-detecting surface 7 and is provided with a terminal for detecting a photo-detection voltage Vs.

Further, in the photo-detecting surface 7, the cathode 2 is formed separately from the anode 5 and the auxiliary cathode 3 is formed so as to enclose the cathode 2. The cathode 2 is provided with a terminal for detecting the photo-detection voltage Vs.

In a junction surface between the auxiliary cathode 3 and the substrate 4, holes diffuse from the auxiliary cathode 3 to the substrate 4 and electrons diffuse from the substrate 4 to the auxiliary cathode 3, forming a depletion layer 10 (depletion layer region), which is indicated by a region between two dotted lines in the drawing.

The buried oxide 6 is composed of the oxide of the semiconductor constituting the substrate 4 and is provided on the bottom surface of the depletion layer 10 in a contact state. The buried oxide 6 constitutes a dielectric body which is polarized by the charge in the depletion layer 10.

Note that the buried oxide 6 needs only to be a dielectric body polarized by the charge in the depletion layer 10 and may not necessarily be the oxide of the semiconductor constituting the substrate 4.

When the buried oxide 6 is composed of the oxide of the semiconductor constituting the substrate 4, it is sufficient that a process step of forming a thin film serving as the buried oxide 6 through oxidation of the semiconductor is added to a manufacturing process of the photodiode 1 (for example, ion implantation of an oxygen atom), suppressing an increase in cost due to formation of the buried oxide 6.

When light irradiates the photo-detecting surface 7 of the photodiode 1 constituted as described above, an electron-hole pair is generated at a junction between the auxiliary cathode 3 and the substrate 4 and accumulated in the depletion layer 10. Therefore, the light having irradiated the photo-detecting surface 7 can be detected as a voltage between the anode 5 and the cathode 2.

As described above, the substrate 4 and the anode 5 constitute a first conductivity type (p-type) semiconductor substrate on which the photo-detecting surface 7 is formed.

In addition, the cathode 2 and the auxiliary cathode 3 constitute a second conductivity type (n-type) semiconductor region provided in the semiconductor substrate (substrate 4).

Figure 2A:
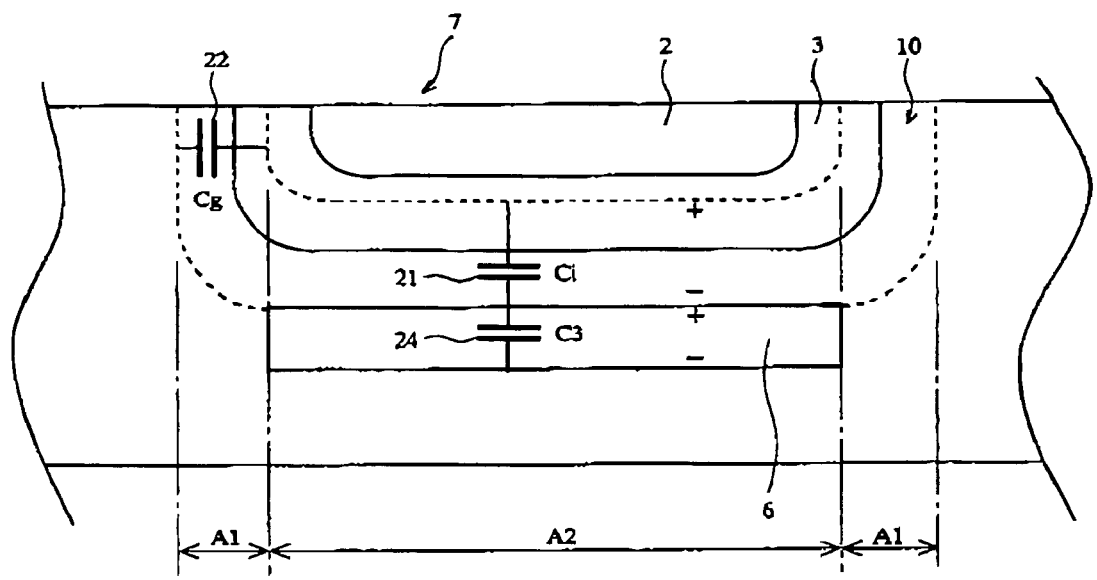
FIG. 2A is a view for explaining a shape and an operation of a buried oxide.

FIG. 2A is a view for explaining a shape and an operation of the buried oxide 6.

As indicated by dotted lines of FIG. 2A, the depletion layer 10 is formed over the entire junction surface of the auxiliary cathode 3 and the substrate 4.

Since the auxiliary cathode 3 is enclosed by the substrate 4 except at a portion of the photo-detecting surface 7, the auxiliary cathode 3 is also enclosed by the depletion layer 10. The thickness of the depletion layer 10 is substantially uniform and about 0.1 to 2 or 3 μm.

In this embodiment, the thickness of the buried oxide 6 is set to approximately equal to that (A1) of the depletion layer 10, and the size of the buried oxide 6 in a direction parallel to the photo-detecting surface 7 is set to approximately equal to the size of the inner surface (A2) of the depletion layer 10.

Note that the shape of the buried oxide 6 is an example and may be larger (or smaller) than the A2 or may enclose the auxiliary cathode 3.

The thickness of the buried oxide 6 can be appropriately selected such that the sum of the capacitances of a capacitor 23 and a capacitor 24 described below is smaller.

The depletion layer 10 forms capacitors, which can be considered as a capacitor 22 (capacitance Cg) and a capacitor 21 (capacitance Ci) that are connected in parallel.

Here, the capacitor 22 is formed in the auxiliary cathode 3 in the side surface direction of the auxiliary cathode 3 (in a direction perpendicular to the photo-detecting surface 7). The capacitor 21 is formed in the auxiliary cathode 3 in the bottom surface direction of the auxiliary cathode 3 (in a direction parallel to the photo-detecting surface 7).

Therefore, a positive charge due to a positive ion is generated in the depletion layer 10 on the side of the auxiliary cathode 3, and a negative charge due to a negative ion is generated in the depletion layer 10 on the side of the substrate 4.

On the other hand, the buried oxide 6 is a dielectric body and in contact with the depletion layer 10 on the surface opposed to the auxiliary cathode 3, which yields polarization in the buried oxide 6 by a field formed by negative charges generated in the depletion layer 10. Accordingly, positive charges are induced on the surface side of the buried oxide 6 which is opposed to the auxiliary cathode 3, while negative charges are induced on the other surface side thereof. Thus, the buried oxide 6 forms the capacitor 24 (capacitance C3).

Figure 2B:
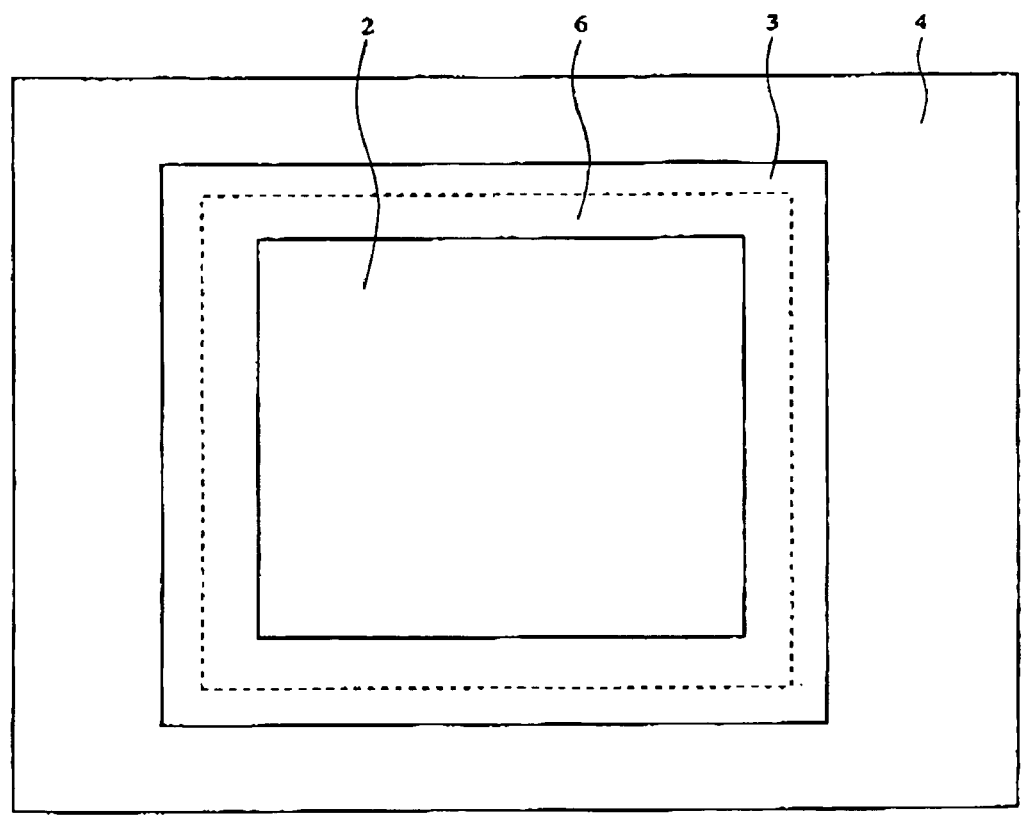
FIG. 2B shows a cathode viewed from a photo-detecting surface side.

FIG. 2B shows the cathode 2 viewed from the side of the photo-detecting surface 7.

The cathode 2 is formed in a rectangular shape and the auxiliary cathode 3 is formed in a substantially similar shape around the cathode 2.

The buried oxide 6 is also formed in a rectangular shape, the periphery of which is larger than that of the cathode 2 and is smaller than that of the auxiliary cathode 3.

Note that the cathode 2, the auxiliary cathode 3, and the buried oxide 6 are not limited to have the rectangular shape and can have any shape, for example, circular or elliptical shape. Further, any size of the cathode 2 can be adopted as long as a sufficient junction with a metal wiring can be obtained.

Referring to FIG. 2A again, description of the total junction capacitance Cs in a case in which the buried oxide 6 is provided will be made.

When the buried oxide 6 is provided, the total junction capacitance Cs is the composite of: the capacitances of the capacitor 21 (capacitance Ci) and the capacitor 24 (capacitance C3), which are connected in series; and the capacitance of the capacitor 22 (capacitance Cg), which is connected in parallel to the capacitors 21 and 24. The following equation (4) thus can be obtained.

$$Cs = Cg + Ci \times C3/(Ci + C3) \quad (4)$$

Comparing the equation (4) with the equation (1) of the conventional art, it is found that the second term of the right side of the equation (4) is smaller than that (Ci) of the equation (1).

Accordingly, the total junction capacitance Cs of the photodiode 1 is smaller than that of the conventional art.

As a result, it is found from the expression (3) that the total diode capacitance Ct of the photodiode 1 is smaller than that of the conventional art, and the photo-detection voltage Vs of the photodiode 1 is larger than that of the conventional example.

Thus, providing the buried oxide 6 in the photodiode 1 can increase the photo-detection voltage Vs of the photodiode 1 and can improve the SN ratio.

Next, modified examples of the position where the buried oxide 6 is formed will be described.

Figure 3A:
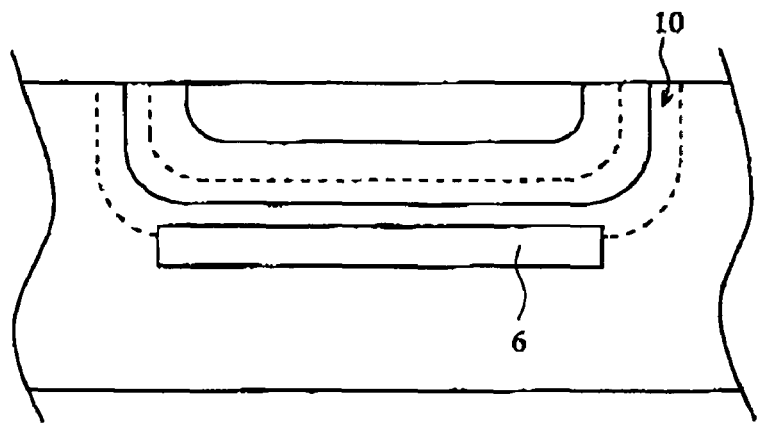
FIGS. 3A to 3C are views for explaining modified examples of a position where a buried oxide is formed.

FIG. 3A shows an example in which a part of the buried oxide 6 is formed in the depletion layer 10.

A part of the buried oxide 6, which includes a surface opposed to the depletion layer 10, is formed in the depletion layer 10, while the other part of the buried oxide 6, which includes a surface opposed to the above-mentioned surface, is formed outside the depletion layer 10.

Figure 3B:
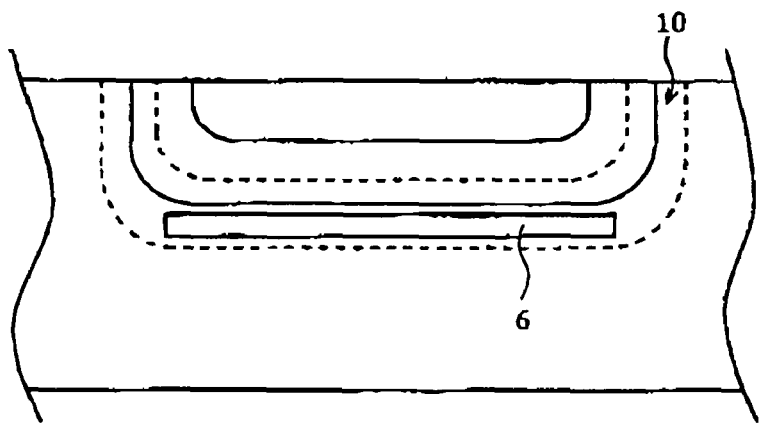

FIG. 3B shows an example in which the buried oxide 6 is entirely formed in the depletion layer 10.

This corresponds to a case in which the buried oxide 6 is inserted into a capacitor formed in the depletion layer 10 as a dielectric material.

Figure 3C:
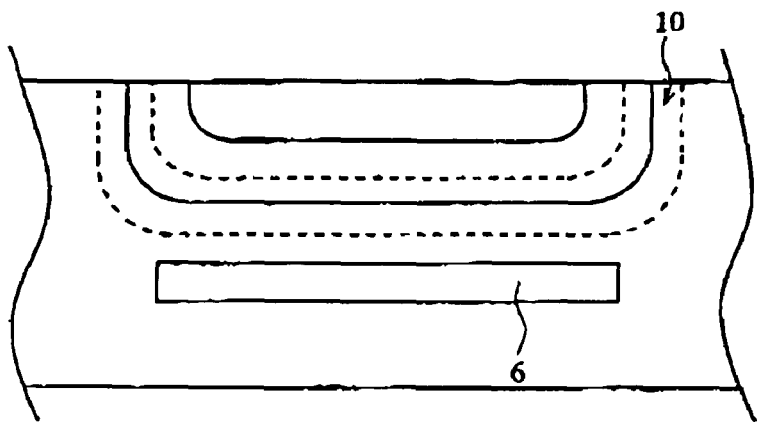

FIG. 3C shows an example in which the buried oxide 6 is formed outside the depletion layer 10. In this case, it is advantageous to form the buried oxide 6 to be as close to the depletion layer 10 as possible because the polarization of the buried oxide 6 becomes smaller as the buried oxide 6 is separated from the depletion layer 10.

Figure 4:
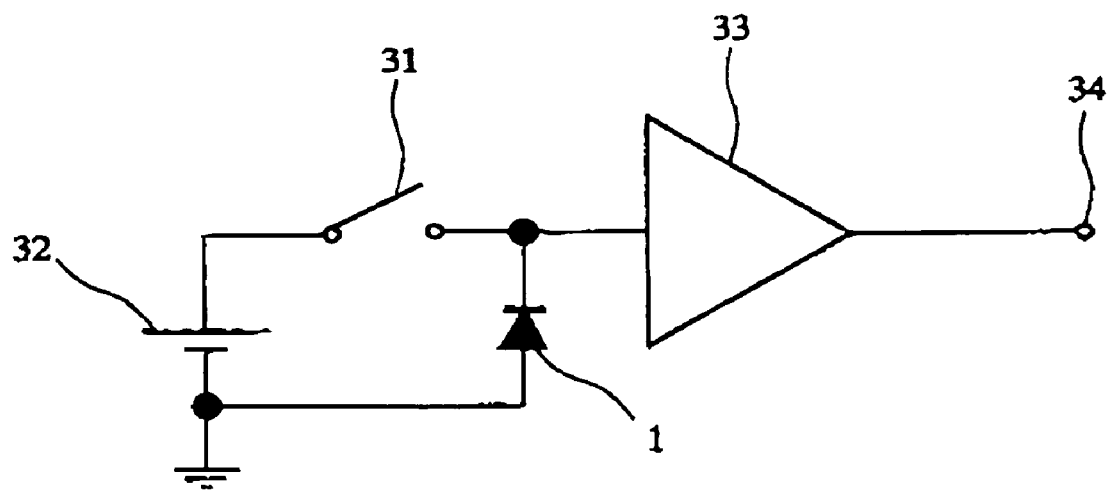
FIG. 4 is a circuit diagram as an example.
Figure 5A:
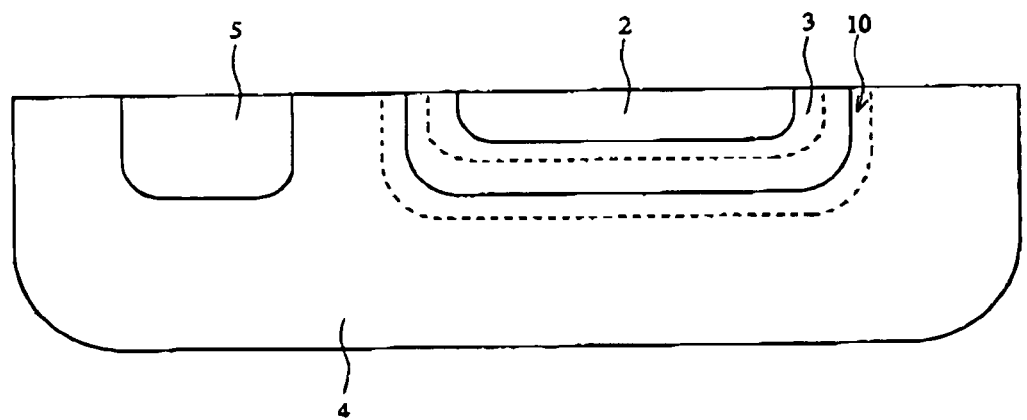
FIGS. 5A and 5B are views for explaining conventional art.
Figure 5B:
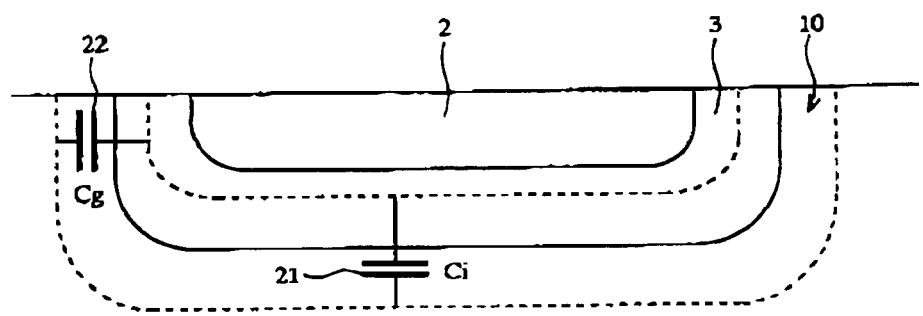

FIG. 4 is a circuit diagram showing a general applied circuit using the photodiode 1.

As shown in FIG. 4, the anode 5 of the photodiode 1 is grounded, and the cathode 2 is connected to an amplifier 33.

The amplifier 33 amplifies the output (photo-detection voltage Vs) from, the photodiode 1 and sends it as a photo-signal through an output terminal 34.

In addition, the photodiode 1 and a battery for initialization 32 constitute a closed circuit through an on/off switch 31 for initialization.

Application of reverse voltage to the photodiode 1 by closing the initialization switch 31 can initialize the accumulated charges, which are photocharge Qp, in the depletion layer 10 of the photodiode 1.

According to the embodiment described above, following effects can be obtained.

(1) Arrangement of the buried oxide 6 can yield the smaller total junction capacitance CE and the higher photo-detection voltage Vs.

(2) Increase in the photo-detection voltage Vs can improve the SN ratio of the photodiode 1.

(3) Easy formation of the buried oxide 6, for example, by implanting oxygen ions, permits low-cost manufacturing of the photodiode 1.

In this embodiment, the cathode 2 and the auxiliary cathode 3 are n-type semiconductors and the substrate 4 and the anode 5 are p-type semiconductors. However, the polarities of the semiconductors can be exchanged. That is, regions corresponding to the cathode 2 and the auxiliary cathode 3 can be formed by p-type semiconductors to function as anodes and regions corresponding to the substrate 4 and the anode 5 can be formed by n-type semiconductors to function as cathodes.

What is claimed is:

1. An image sensor, comprising:
    a semiconductor substrate of a first conductivity type having a photo-detecting surface;
    a semiconductor region of a second conductivity type disposed under the photo-detecting surface and forming a junction surface with the semiconductor substrate; and
    a dielectric body provided in the semiconductor substrate beneath the junction surface so that a width of the dielectric body in a direction parallel to the photo-detecting surface does not extend beyond a width of the semiconductor region in the direction parallel to the photo-detecting surface, the dielectric body being polarized due to charges forming a depletion region generated by the semiconductor substrate and the semiconductor region, the depletion region being formed over the entire junction surface of the semiconductor region and the semiconductor substrate so as to enclose the semiconductor region except at a portion of the photo-detecting surface, and the width of the dielectric body being approximately equal to a width of an inner surface of the depletion region and smaller than a width of an outer surface of the depletion region in the direction parallel to the photo-detecting surface of the semiconductor substrate.

2. An image sensor according to claim 1; wherein the dielectric body comprises an oxide of a semiconductor forming the semiconductor substrate.

3. An image sensor according to claim 1; wherein the dielectric body is in contact with the depletion region.

4. An image sensor according to claim 1; wherein at least a part of the dielectric body is disposed in the depletion region.

5. An image sensor according to claim 2; wherein the dielectric body is in contact with the depletion region.

6. An image sensor according to claim 2; wherein at least a part of the dielectric body is disposed in the depletion region.

7. An image sensor according to claim 1; wherein the dielectric body has a thickness approximately equal to a thickness of the depletion region.

8. An image sensor according to claim 7; wherein the thickness of the depletion region is in the range of about 0.1 µm to 3 µm.

9. An image sensor according to claim 1; wherein the dielectric body is disposed in contact with a lower end of the depletion region.

10. An image sensor according to claim 1; wherein the dielectric body is disposed entirely within the depletion region.

11. An image sensor according to claim 1; wherein the dielectric body is disposed entirely outside of the depletion region.

12. An image sensor, comprising:
a semiconductor substrate of a first conductivity type having a photo-detecting surface;
a semiconductor region of a second conductivity type disposed under the photo-detecting surface and forming a junction surface with the semiconductor substrate; and
a dielectric body provided in the semiconductor substrate, the dielectric body being polarized due to charges forming a depletion region generated by the semiconductor substrate and the semiconductor region so that the dielectric body is connected in series with a capacitor formed in the depletion region to reduce a total capacitance at the junction surface between the semiconductor region and the semiconductor substrate, the depletion region being formed over the entire junction surface of the semiconductor region and the semiconductor substrate so as to enclose the semiconductor region except at a portion of the photo-detecting surface, a width of the dielectric body being approximately equal to a width of an inner surface of the depletion region and smaller than a width of an outer surface of the depletion region in a direction parallel to the photo-detecting surface of the semiconductor substrate.

13. An image sensor according to claim 12; wherein the dielectric body comprises an oxide of a semiconductor forming the semiconductor substrate.

14. An image sensor according to claim 12; wherein the dielectric body is in contact with the depletion region.

15. An image sensor according to claim 12; wherein at least a part of the dielectric body is disposed in the depletion region.

16. An image sensor according to claim 12; wherein the dielectric body is disposed entirely within the depletion region.

17. An image sensor according to claim 12; wherein the dielectric body is disposed entirely outside of the depletion region.

18. An image sensor, comprising:
a semiconductor substrate of a first conductivity type, the semiconductor substrate having an upper surface forming a photo-detecting surface, a lower surface opposite to the upper surface, and opposite side surfaces interconnecting the upper and lower surfaces;
a semiconductor region of a second conductivity type disposed under the upper surface and forming a junction surface with the semiconductor substrate; and
a dielectric body disposed entirely within the semiconductor substrate so that the dielectric body does not extend to any of the opposite side surfaces of the semiconductor substrate, the dielectric body being polarized due to charges forming a depletion region generated by the semiconductor substrate and the semiconductor region, the depletion region being formed over the entire junction surface of the semiconductor region and the semiconductor substrate so as to enclose the semiconductor region except at a portion of the photo-detecting surface, a width of the dielectric body being approximately equal to a width of an inner surface of the depletion region and smaller than a width of an outer surface of the depletion region in a direction parallel to the photo-detecting surface of the semiconductor substrate, and the dielectric body is disposed on a bottom surface of the depletion region in a contact state with the depletion region.

19. An image sensor according to claim 18; wherein the dielectric body comprises an oxide of a semiconductor forming the semiconductor substrate.

20. An image sensor according to claim 18; wherein at least a part of the dielectric body is disposed in the depletion region.

21. An image sensor according to claim 18; wherein the dielectric body is disposed entirely within the depletion region.

22. An image sensor according to claim 18; wherein the dielectric body is disposed entirely outside of the depletion region.

23. An image sensor according to claim 12; wherein the dielectric body is disposed on a bottom surface of the depletion region in a contact state with the depletion region.

* * * * *